(12) United States Patent
Perez-Bolivar et al.

(10) Patent No.: US 9,099,618 B1
(45) Date of Patent: Aug. 4, 2015

(54) LIGHTING DEVICE HAVING A PATTERNED CONFORMAL COATING DOPED WITH A LUMINESCENT MATERIAL

(71) Applicant: Grote Industries, LLC, Madison, IN (US)

(72) Inventors: Cesar Perez-Bolivar, Madison, IN (US); Michael Redwine, Madison, IN (US)

(73) Assignee: Grote Industries, LLC, Madison, IN (US)

( * ) Notice: Subject to any disclaimer, the term of this patent is extended or adjusted under 35 U.S.C. 154(b) by 0 days.

(21) Appl. No.: 14/251,022

(22) Filed: Apr. 11, 2014

(51) Int. Cl.
| | |
|---|---|
| *H01J 1/62* | (2006.01) |
| *H01L 33/50* | (2010.01) |
| *H01L 27/15* | (2006.01) |
| *H01L 33/44* | (2010.01) |
| *H01L 33/00* | (2010.01) |

(52) U.S. Cl.
CPC .............. *H01L 33/505* (2013.01); *H01L 27/15* (2013.01); *H01L 33/005* (2013.01); *H01L 33/44* (2013.01); *H01L 33/502* (2013.01); *H01L 2933/0025* (2013.01); *H01L 2933/0041* (2013.01)

(58) Field of Classification Search
CPC .................... H01L 2924/0002; H01L 2924/00; H01L 33/58
USPC .......................................... 313/498, 502, 506
See application file for complete search history.

(56) References Cited

U.S. PATENT DOCUMENTS

| | | | |
|---|---|---|---|
| 7,049,761 | B2 | 5/2006 | Timmermans et al. |
| 7,510,299 | B2 | 3/2009 | Timmermans et al. |
| 7,847,302 | B2 | 12/2010 | Basin et al. |
| 8,017,417 | B1 | 9/2011 | Cho |
| 8,093,823 | B1 | 1/2012 | Ivey et al. |
| 8,247,985 | B2 | 8/2012 | Timmermans et al. |
| 8,382,327 | B2 | 2/2013 | Timmermans et al. |
| 8,482,212 | B1 | 7/2013 | Ivey et al. |
| 2012/0193648 | A1 | 8/2012 | Donofrio et al. |
| 2012/0319148 | A1 | 12/2012 | Donofrio et al. |
| 2013/0169179 | A1 | 7/2013 | Timmermans et al. |
| 2014/0076397 | A1 | 3/2014 | Wagenblast et al. |

FOREIGN PATENT DOCUMENTS

| | | |
|---|---|---|
| TW | 201236210 A | 9/2012 |
| WO | 2012106109 A1 | 8/2012 |

OTHER PUBLICATIONS

International Search Report and Written Opinion of the International Searching Authority mailed Jun. 10, 2015 in the corresponding PCT international patent application No. PCT/US2015/015145.

*Primary Examiner* — Vip Patel
(74) *Attorney, Agent, or Firm* — Posz Law Group, PLC

(57) ABSTRACT

A lighting device is provided, comprising: a substrate; two or more light-emitting elements formed over the substrate; a first transparent conformal layer formed over the two or more light-emitting elements in a pattern, the first transparent conformal layer being doped with a luminescent material; a second transparent conformal layer formed over a portion of the substrate not covered by the two or more light-emitting elements, the second transparent conformal layer not being doped with the luminescent material.

26 Claims, 7 Drawing Sheets

LIGHTING DEVICE HAVING A PATTERNED CONFORMAL COATING DOPED WITH A LUMINESCENT MATERIAL

FIELD OF THE INVENTION

The present invention relates generally to a device that contains a number of light-emitting elements beneath a luminescent layer that serves to spread out the light emitted from the individual light-emitting elements to show a larger pattern. More particularly, the present invention relates to structure in which a luminescent layer spreads the light from multiple light-emitting elements such that a bright pattern is shown rather than individual points of light.

BACKGROUND OF THE INVENTION

Light-emitting diodes (LEDs) can be used to provide low-cost, low-power lighting in a variety of situations, including home, automotive, and commercial. Furthermore, multiple LEDs can be placed together in order to form patterns that can be recognized by those observing the LEDs.

However, each LED is effectively a point-source of light. When multiple LEDs are placed together in any sort of pattern, the pattern forms only a pattern of dots of light, which can lead to some problems. For example, such a pattern may be misinterpreted if an observer joins the dots of light together in a manner unintended by the user. Also, the visual display of multiple dots of light is not necessarily aesthetically pleasing for showing a pattern.

As a result of this, there is an inherent limit on the usefulness and attractiveness of conventional patterned LED devices. For functional and aesthetic reasons, many designers and consumers would like any LED pattern to be more easily visible and contiguous in its appearance.

It would therefore be desirable to provide a flexible lighting device that includes multiple light-emitting elements in a pattern such that the light from the light-emitting elements was diffused into the pattern rather than appearing from the point-sources of the late-emitting elements.

SUMMARY OF THE INVENTION

A lighting device, is provided comprising: a substrate; two or more light-emitting elements formed over the substrate; a first transparent conformal layer formed over the two or more light-emitting elements in a pattern, the first transparent conformal layer being doped with a luminescent material; a second transparent conformal layer formed over a portion of the substrate not covered by the two or more light-emitting elements, the second transparent conformal layer not being doped with the luminescent material.

The luminescent material may be remote phosphor.

The first transparent conformal layer may be contiguous.

The luminescent material doped in the first transparent conformal may convert an incoming wavelength of incoming light from the two or more light-emitting elements to an outgoing wavelength different from the incoming wavelength.

The first transparent conformal layer may have a thickness between 0.1 micron to 10 millimeters.

The first transparent conformal layer may comprise polyurethane, silicone, or acrylic having a refractive index between 1.7 and 2.1.

The pattern may be one of: a circle, a square, a triangle, a line, or an arrow.

The lighting device may further comprise a transparent affixing layer formed between the first and second transparent conformal layers and the substrate, the transparent affixing layer surrounding the two or more light-emitting elements.

At least one of the first and second transparent conformal layers may be is made of a flame retardant material.

The two or more light-emitting elements may be two or more light-emitting diodes, and each corresponding light-emitting diode of the two or more light-emitting diodes may have a pair of electrodes formed on a same side of the corresponding light-emitting diode. The two or more light-emitting elements may be two or more light-emitting diodes, and each corresponding light-emitting diode of the two or more light-emitting diodes may have a pair of electrodes formed on different sides of the corresponding light-emitting diode.

The two or more light-emitting elements may include a first light-emitting element and a second light-emitting element, the first light-emitting element being configured to emit light in a first direction, and the second light-emitting element being configured to emit light in a second direction different from the first direction.

The first direction may be toward the first transparent conformal layer, and the second direction may be toward the substrate.

A method of forming a lighting device, is provided, comprising: providing a substrate; forming two or more light-emitting elements over the substrate; forming a first transparent conformal layer over the two or more light-emitting elements in a pattern, the first transparent conformal layer being doped with a luminescent material; forming a second transparent conformal layer over a portion of the substrate not covered by the two or more light-emitting elements, the first transparent conformal layer not being doped with the luminescent material.

The method may further comprise forming a transparent affixing layer between the first and second transparent conformal layers and the substrate, the transparent affixing layer surrounding the two or more light-emitting elements.

At least one of the first and second transparent conformal layers may be is made of a flame retardant material.

The two or more light-emitting elements may be two or more light-emitting diodes, and each corresponding light-emitting diode of the two or more light-emitting diodes may have a pair of electrodes formed on a same side of the corresponding light-emitting diode. The two or more light-emitting elements may be two or more light-emitting diodes, and each corresponding light-emitting diode of the two or more light-emitting diodes may have a pair of electrodes formed on different sides of the corresponding light-emitting diode.

The two or more light-emitting elements may include a first light-emitting element and a second light-emitting element, the first light-emitting element being configured to emit light in a first direction, and the second light-emitting element being configured to emit light in a second direction different from the first direction.

The first direction may be toward the first transparent conformal layer, and the second direction may be toward the substrate.

BRIEF DESCRIPTION OF THE DRAWINGS

The accompanying figures where like reference numerals refer to identical or functionally similar elements and which together with the detailed description below are incorporated in and form part of the specification, serve to further illustrate an exemplary embodiment and to explain various principles and advantages in accordance with the present invention. These drawings are not necessarily drawn to scale.

DETAILED DESCRIPTION

The instant disclosure is provided to further explain in an enabling fashion the best modes of performing one or more embodiments of the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms such as first and second, and the like, if any, are used solely to distinguish one from another entity, item, or action without necessarily requiring or implying any actual such relationship or order between such entities, items or actions. It is noted that some embodiments may include a plurality of processes or steps, which can be performed in any order, unless expressly and necessarily limited to a particular order; i.e., processes or steps that are not so limited may be performed in any order.

Furthermore, elements having the same number represent the same element across the various figures, and throughout the disclosure. Their description is not always repeated for each embodiment, but may be inferred from previous descriptions. Elements that have the same number but have the addition of a letter designator indicate distinct embodiments of a more generic element.

Light-Emitting Element with Luminescent Conformal Coat

Figure 1:
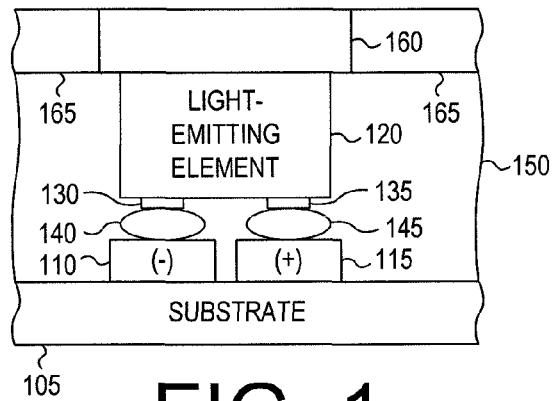
FIG. 1 is a cross-sectional view of a light-emitting element in a flexible lighting array according to a disclosed embodiment.

FIG. 1 is a cross-sectional view of a light-emitting element in a flexible lighting array according to disclosed embodiment. As shown in FIG. 1, the light-emitting element system includes a substrate 105 first and second conductive elements 110, 115, a light-emitting element 120, a cathode 130, an anode 135, first and second electrical connectors 140, 145, an affixing layer 150, a first conformal layer 160, and a second conformal layer 165.

The substrate 105 serves as a base for the remainder of the flexible lighting device. As a reference direction, the substrate 105 can be considered to be a "bottom" substrate upon which the other elements are stacked. However, this is as a point of reference only. The flexible lighting device has no inherent direction, and can be oriented in any manner, even with the substrate 105 being on the "top" of the structure.

The substrate 105 can be made of polyethylene terephthalate (PET), polyethylene napthalate (PEN), polyester, a polymer, an oxide-coated polymer, a flexible plastic, a metal-coated flexible plastic, or any suitable flexible material. If the entire flexible lighting device needs to be flexible, then the substrate 105 should be flexible. Because light does not shine out of the substrate 105, it is not necessary for the substrate 105 to be transparent to light.

The first and second conductive elements 110, 115 are located on the substrate 105. Each is made of a conductive material that is connected to a control circuit used to control the flexible lighting device, and is configured to carry a control current generated by the control circuit. In the disclosed embodiment, the first and second conductive elements 110, 115 are buss bars used to conduct electricity throughout a flexible lighting device. In alternate embodiments the first and second conductive elements 110, 115 could be wires or any other conductive structure that can pass current to the light-emitting element 120.

The first and second conductive elements 110, 115 may be made of copper, silver, aluminum, or any suitable conductive metal or conductive oxide. If the resulting lighting device must remain flexible, the first and second conductive elements 110, 115 should also be configured such that they can bend without breaking or losing their ability to carry a current.

The light-emitting element 120 is configured to generate light based on the control current carried on the first and second conductive elements 110, 115. One exemplary light-emitting element 120 used in the disclosed embodiments is a light-emitting diode (LED). An LED has an anode 135 (i.e., a positive side) and a cathode 130 (i.e., a negative side), and operates to generate light of a specific wavelength (from infrared to ultraviolet, i.e., having a wavelength from 10 nm to 100,000 nm) when current flows through the LED from the anode to the cathode. In the embodiment of FIG. 1, the cathode 130 and the anode 135 of the light-emitting element 120 are both formed on the same side of the light-emitting element 120.

The cathode 130 is an electrical contact on the light-emitting element 120 that is electrically connected to the first conductive element 110. Likewise, the anode 135 is an electrical contact on the light-emitting element 120 that is electrically connected to the second conductive element 115.

The first and second conductive connectors 140, 145 operate to electrically connect the cathode 130 and anode 135 of the light-emitting element 120 to the first and second conductive elements 110, 115. In particular, the cathode 130 is connected to the first conductive element 110 through the first conductive connector 140. Likewise, the anode 135 is connected to the second conductive element 115 through the second conductive connector 145. In various embodiments, the conductive connectors 140, 145 can be: silver epoxy dots, a conductive adhesive, metal pads, or other conductive metal elements.

The affixing layer 150 is located over the substrate 105 and around the light-emitting element 120, and is configured to fix the light-emitting element 120 in place. Because light from the light-emitting element 120 may need to pass through the affixing layer 150, it is generally desirable that the affixing layer be substantially transparent to the wavelengths of light that are emitted from the light-emitting element 120.

The first and second conformal layers 160, 165 are made of a transparent protective substance formed over the substrate 105 and the light-emitting element 120 to protect the light-emitting element from exposure to the elements and harm from being directly touched.

The first and second conformal layers 160, 165 are generally deposited in a viscous form and then hardened using heat, infrared light or ultraviolet light. The conformal layers 160, 165 may also be air cured.

In the embodiment of FIG. 1, the first conformal layer 160 is doped with a luminescent material, such as remote phosphor, which causes the light from the light-emitting element 120 to be diffused, reemitted, diffracted, or reflected such that it appears to be coming from a diffuse area in the first conformal layer 160 above the light-emitting element 120, rather than solely from the light-emitting element 120. Likewise, the second conformal layer 165 is not doped with a luminescent material so that any light passing through the second conformal layer 165 will not be diffused as in the first conformal layer 160.

Figure 2:
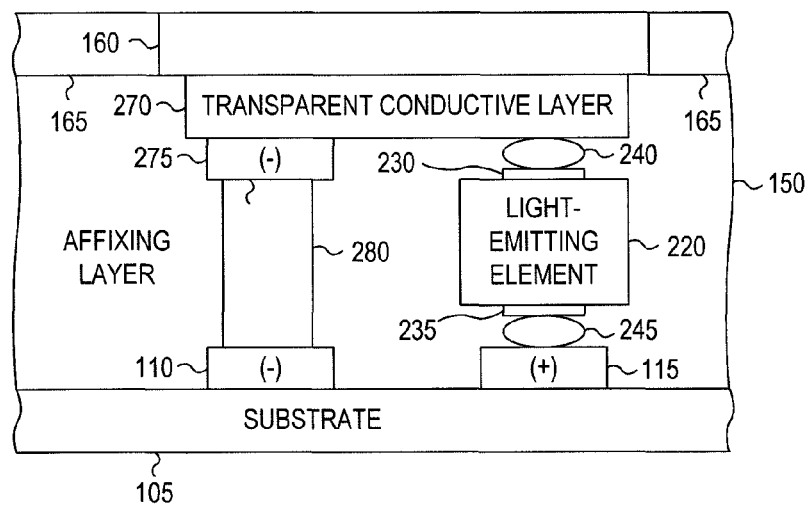
FIG. 2 is a cross-sectional view of light-emitting element in a flexible lighting array according to another disclosed embodiment.

FIG. 2 is a cross-sectional view of light-emitting element in a flexible lighting array according to another disclosed embodiment. As shown in FIG. 2, the late-emitting element system includes a substrate 105, first and second conductive elements 110, 115, a light-emitting element 220, a cathode 230, an anode 235, first and second electrical connectors 240, 245, an affixing layer 150, a first conformal layer 160, a second conformal layer 165, a transparent conductive layer 270, a third conductive element 275, and a connection element 280.

In this embodiment, the substrate 105, first and second conductive elements 110, 115, affixing layer 150, first conformal layer 160, and second conformal layer 165 operate in the same manner as disclosed above with respect to the embodiment of FIG. 1. As a result, they will not be described again with respect to the embodiment of FIG. 2.

The light-emitting element 220 is configured to generate light based on the control current carried on the first and second conductive elements 110, 115. One exemplary light-emitting element 220 used in the disclosed embodiments is a light-emitting diode (LED). An LED has an anode 235 (i.e., a positive side) and a cathode 230 (i.e., a negative side), and operates to generate light of a specific wavelength (from infrared to ultraviolet, i.e., having a wavelength from 10 nm to 100,000 nm) when current flows through the LED from the anode to the cathode. In the embodiment of FIG. 2, the cathode 230 and the anode 235 of the light-emitting element 220 are formed on opposite sides of the light-emitting element 220. In particular, in this embodiment, the anode 235 is formed on a bottom of the light-emitting element 220, while the cathode 230 is formed on a top of the light-emitting element 220.

The cathode 230 is an electrical contact on the light-emitting element 220 that is electrically connected to a first conductive element 110. Likewise, the anode 235 is an electrical contact on the light-emitting element 220 that is electrically connected to a negative conductive element 110.

The first and second conductive connectors 240, 245 operate to electrically connect the cathode 230 and anode 235 of the light-emitting element 220 to the transparent conductive layer 270 and the second conductive element 115. In particular, the cathode 230 is connected to the transparent conductive layer 270 through the first conductive connector 240. Likewise, the anode 235 is connected to the second conductive element 215 through the second conductive connector 245. In various embodiments, the conductive connectors 240, 245 can be: silver epoxy dots, a conductive adhesive, metal pads, or other conductive metal elements.

The transparent conductive layer 270 serves to electrically connect the cathode 235 to the third conductive element 275. It can be any suitable transparent, conductive material.

The third conductive element 275 runs parallel to and above the negative conductive element 110, but is otherwise of similar construction. Thus, the third conductive element 540 is arranged at a height above the light-emitting element 120, and the first conductive element 110 is arranged near a height below the light-emitting element 120.

The connection element 280 is configured to electrically connect the third conductive element 275 to the negative conductive element 110. In various embodiments, the connection element 280 can be any suitably conductive metal elements.

Figure 3:
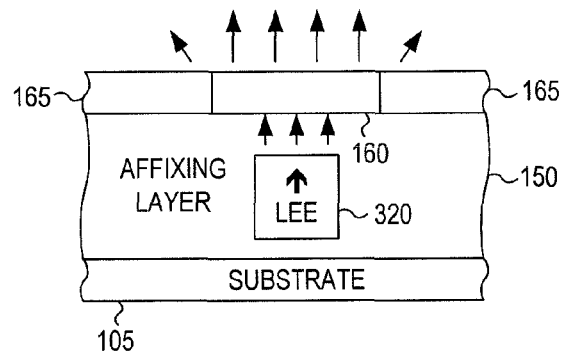
FIG. 3 is a cross-sectional view of a generic representation of a light-emitting element in a flexible lighting array according to disclosed embodiments.

FIG. 3 is a cross-sectional view of a generic representation of a light element in a flexible lighting array according to disclosed embodiments. This can represent either the light-emitting element 120 shown in FIG. 1 or the light-emitting element 220 shown in FIG. 2. In each case, a light-emitting element 320 is formed over a substrate 105, in an affixing layer 150, and is covered by first and second conformal layers 160, 165. The light-emitting element 320 emits light that can pass through both the first conformal layer 160 and the second conformal layer 165. In FIG. 3, the arrow shown on the light-emitting element 320 indicates a direction in which light is emitted from the light-emitting element 320.

Multiple Light-Emitting Elements Beneath a Luminescent Conformal Layer

Figure 4:
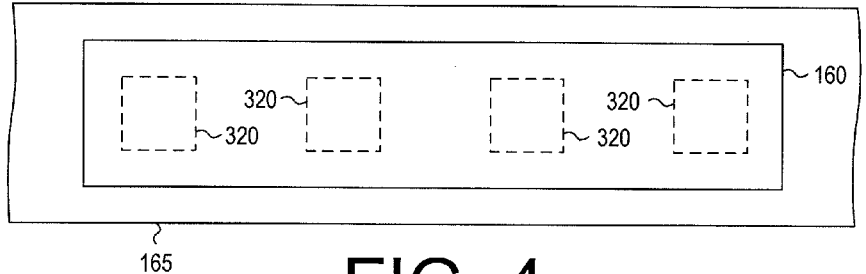
FIG. 4 is an overhead view of a lighting device having multiple light-emitting elements arranged in a pattern according to disclosed embodiments.

FIG. 4 is an overhead view of a lighting device having multiple light-emitting elements arranged in a pattern according to disclosed embodiments. As shown in FIG. 4, four light-emitting elements 320 are arranged in a line. A first conformal layer 160 covers all four of the light-emitting elements 320, while a second conformal layer 165 covers an area of the lighting device that does not contain the four light-emitting elements 320.

As noted above, the first conformal layer 160 is doped with a luminescent material, such as remote phosphor, which causes light that passes through it to be diffused such that it does not appear to come directly from its source, but instead appears to come from throughout the first conformal layer 160.

In contrast, the second conformal layer 165 is not doped with a luminescent material, and so passes light from the light-emitting elements 320 directly through it.

Figure 5:
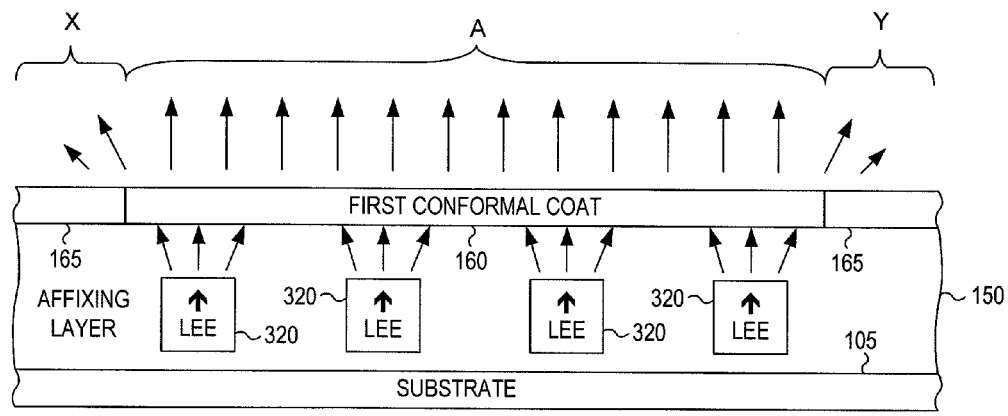
FIG. 5 is a cross-sectional view of the lighting device of FIG. 4 according to disclosed embodiments.

FIG. 5 is a cross-sectional view of the lighting device of FIG. 4 according to disclosed embodiments. As shown in FIG. 5, four light-emitting elements 320 are formed in a line beneath the first conformal layer 160.

Each of these light-emitting elements 320 are oriented such that they emit light in an upper direction (i.e., a direction opposite the substrate and toward the first conformal layer 160. As a result, the majority of light emitted by the light-emitting elements 320 will pass from the top of the light-emitting elements 320 into the first conformal layer 160, where it will be diffused, reemitted, diffracted, or reflected such that it appears to come from the entirety of the first conformal layer, rather than from the individual point-sources of the light-emitting elements 320.

A certain amount of light will also bleed over into the second conformal layer 160, where it will pass directly through without being diffused.

In this way, the structure shown in FIG. 5 can provide light in three different areas: area A, area X, and area Y. In area A, the light will appear to come from the first conformal layer 160 as a whole, allowing the pattern formed by the first conformal layer 160 to appear to glow. In contrast, in area X and area Y, the light will not be diffused, and will simply appear to come from whichever light-emitting element 320 it came from. As a result, the second conformal layer 165 will not appear to glow, but will merely pass light through it.

Thus, the structure shown in FIG. 5 can provide for a pattern that is lit by light-emitting elements 320, but that appears to glow as a contiguous shape rather than as a series of individual glowing dots.

Figure 6:
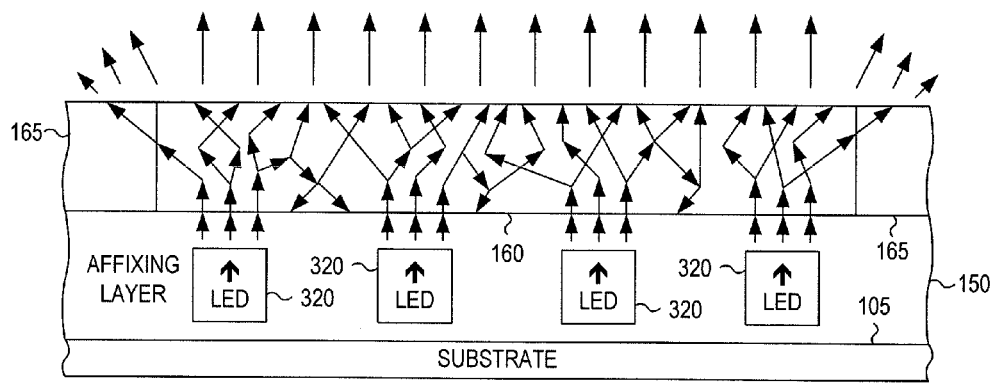
FIG. 6 is a more detailed cross-sectional view of the lighting device of FIG. 4 showing the operation of light in the first and second conformal layers according to disclosed embodiments.

FIG. 6 is a more detailed cross-sectional view of the lighting device of FIG. 4 showing the operation of light in the first and second conformal layers 160, 165 according to disclosed embodiments.

In particular, FIG. 6 shows that light passing through the first conformal layer 160 will contact the luminescent material doped in the first conformal layer 160, and will scatter, possibly multiple times as it contacts multiple dopants, until it emerges from the top, side, or bottom of the first conformal layer 160. The light emitted from the first conformal layer 160 will thus be effectively randomized such that it appears to come out of the top, side, or bottom surface as a whole, rather than from the light-emitting elements 320 below the first conformal layer 160. In this way, the first conformal layer 160 will essentially appear to glow on its own.

It should be noted that any light passing through the side of the first conformal layer 160 and through the second conformal layer 165, will pass straight through the second conformal layer 165, since there is no luminescent dopant to reflect it. As a result, the second conformal layer 165 will not interfere with the appearance of the first conformal layer as glowing on its own, in the shape in which the first conformal layer is arranged.

Figure 7:
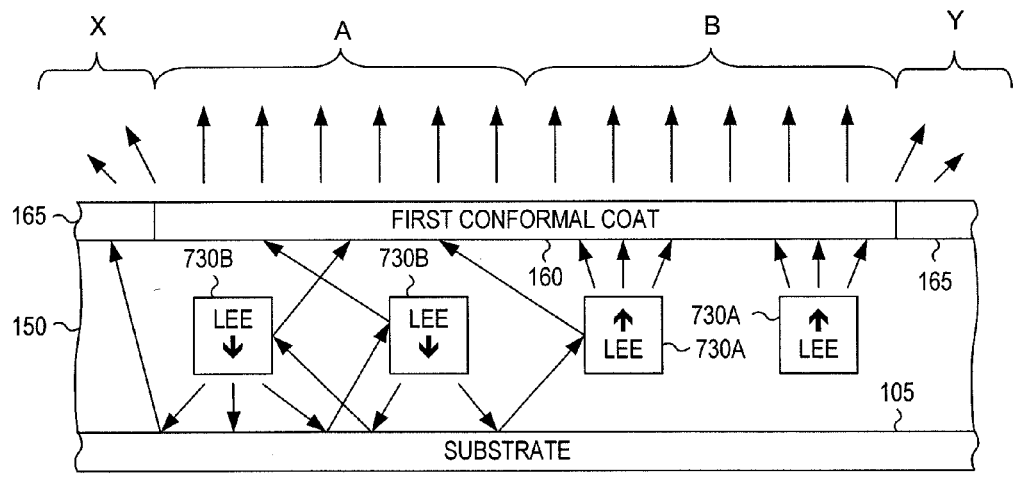
FIG. 7 is a cross-sectional view of the lighting device of FIG. 4 according to other disclosed embodiments.

FIG. 7 is a cross-sectional view of the lighting device of FIG. 4 according to other disclosed embodiments. As shown in FIG. 7, two first light-emitting elements 730A are oriented such that they emit light in a top direction (i.e., directly toward the first conformal layer 160), while two second light-emitting elements 730B are oriented such that they emit light in a bottom direction (i.e., directly toward the substrate 105).

The first light-emitting elements 730A operate exactly as the light-emitting elements 320 in the embodiments of FIGS. 5 and 6. They will emit light in a top direction toward the first conformal layer 160, and that light will be scattered within the first conformal layer 160 such that it appears to come from the first conformal layer 160 itself The second light-emitting elements 730B emit their light in a bottom direction toward the substrate 105. This light will bounce off of the substrate 105, and possibly off of the light-emitting elements 730A, 730B (as well as any other elements that are not shown in FIG. 7) however, as this light enters the first conformal layer 160, it will be diffused in a similar manner to the light from the first light-emitting elements 730A, such that it will appear to come from the first conformal layer 160 in general, and not from the point-source of the second light-emitting elements 730B.

However, since the second light-emitting elements 730B are facing in a bottom direction, and the light must be reflected off the substrate before it reaches the first conformal layer 160, the light coming from the first conformal layer 160 in the area A over the second light-emitting elements 730B will be dimmer than the light in the area B over the first light-emitting elements 730A.

In this way, the structure shown in FIG. 7 can provide light in four different areas: area A, area B, area X, and area Y. In areas A and B, the light will appear to come from the first conformal layer 160 as a whole, allowing the pattern formed by the first conformal layer 160 to appear to glow. But, since, as noted above, the second light-emitting elements 730B in area A are oriented in a bottom direction, the portion of the pattern in area A will be dimmer than the portion of the pattern in area B. In this way, the structure shown in FIG. 7 can provide gradations of light within a pattern, allowing it to emphasize some portion of the pattern.

As in the structure shown in FIG. 5, the light in areas X and Y will not be diffused, and will simply appear to come from whichever light-emitting element 730A, 730B it came from. As a result, the second conformal layer 165 will not appear to glow, but will merely pass light through it.

Therefore, the structure shown in FIG. 7 can provide for a multiple-intensity pattern that is lit by light-emitting elements 730A, 730B, but that appears to glow as a contiguous shape rather than as a series of individual glowing dots.

Figure 8:
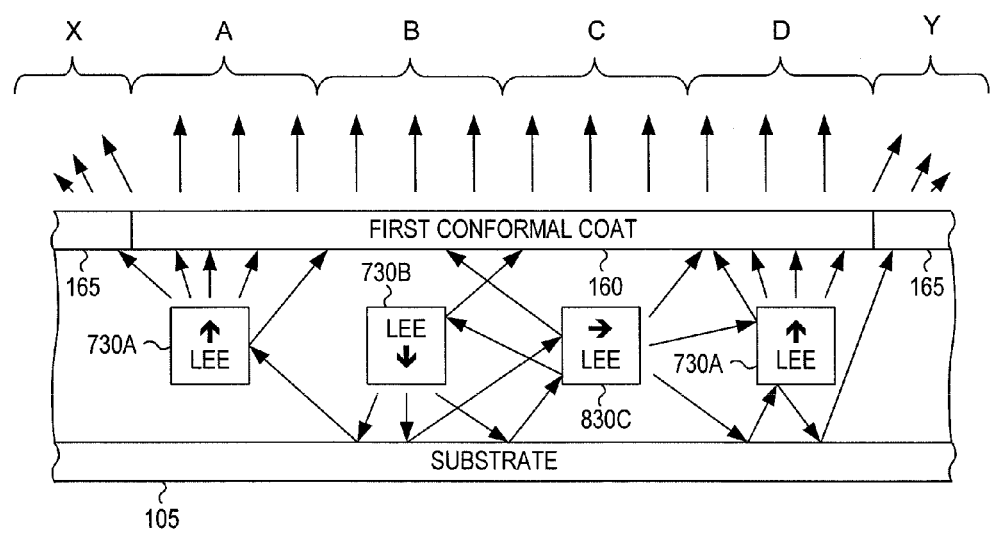
FIG. 8 is a cross-sectional view of the lighting device of FIG. 4 according to still other disclosed embodiments.

FIG. 8 is a cross-sectional view of the lighting device of FIG. 4 according to still other disclosed embodiments. As shown in FIG. 8, two first light-emitting elements 730A are oriented such that they emit light in a top direction (i.e., directly toward the first conformal layer 160), a second light-emitting element 730B is oriented such that it emits light in a bottom direction (i.e., directly toward the substrate 105), and a third light-emitting element 830C is oriented such that it emits light in a side direction (i.e., a direction parallel to the substrate 105 and the first conformal layer 160).

The first light-emitting elements 730A operate exactly as the light-emitting elements 320 in the embodiments of FIGS. 5 and 6. They will emit light in a top direction toward the first conformal layer 160, and that light will be scattered within the first conformal layer 160 such that it appears to come from the first conformal layer 160 itself The second light-emitting element 730B emits its light in a bottom direction toward the substrate 105. This light will bounce off of the substrate 105, and possibly off of the light-emitting elements 730A, 830C (as well as any other elements that are not shown in FIG. 7) however, as this light enters the first conformal layer 160, it will be diffused in a similar manner to the light from the first light-emitting elements 730A, such that it will appear to come from the first conformal layer 160 in general, and not from the point-source of the second light-emitting element 730B.

The third light-emitting element 830C emits its light in a side direction parallel to the substrate 105 and the first conformal layer 160. This light will bounce off of the light-emitting elements 730A, 830C (as well as any other elements that are not shown in FIG. 7), possibly the substrate 105. However, as this light enters the first conformal layer 160, it will be diffused in a similar manner to the light from the first light-emitting elements 730A, such that it will appear to come from the first conformal layer 160 in general, and not from the point-source of the third light-emitting element 830C.

However, since the second light-emitting element 730B is facing in a bottom direction, and the light must be reflected off the substrate before it reaches the first conformal layer 160, the light coming from the first conformal layer 160 in the area B over the second light-emitting element 730B will be dimmer than the light in areas A and D over the first light-emitting elements 730A.

Similarly, since the third light-emitting element 830C is facing in a side direction, and the light must be reflected off the other light-emitting elements 730A, 730B before it reaches the first conformal layer 160, the light coming from the first conformal layer 160 in the area C over the second light-emitting element 730B will be dimmer than the light in areas A and D over the first light-emitting elements 730A, although it will be brighter than the light in area B over the second light-emitting element 730B.

In this way, the structure shown in FIG. 8 can provide light in six different areas: area A, area B, area C, area D, area X, and area Y. In areas A, B, C, and D, the light will appear to come from the first conformal layer 160 as a whole, allowing the pattern formed by the first conformal layer 160 to appear to glow. But, since, as noted above, first light-emitting elements 730 A are oriented in a top direction, the second light-emitting elements 730B in area A are oriented in a bottom direction, and the third light-emitting elements 830C are oriented in a side direction, the portions of the pattern in areas A, B, C, and D will be vary in their brightness based on the orientation of the light-emitting element beneath that area. In this way, the structure shown in FIG. 8 can provide multiple gradations of light within a pattern, allowing it to emphasize some portion of the pattern.

As in the structure shown in FIG. 5, the light in areas X and Y will not be diffused, and will simply appear to come from whichever light-emitting element 730A, 730B, 830C it came from. As a result, the second conformal layer 165 will not appear to glow, but will merely pass light through it.

Therefore, the structure shown in FIG. 8 can provide for a multiple-intensity pattern that is lit by light-emitting elements 730A, 730B, 830C, but that appears to glow as a contiguous shape rather than as a series of individual glowing dots.

Although FIGS. 4-8 a lighting device with four light-emitting elements 320, 730A, 730B, 830C formed beneath a first conformal layer 160, this is by way of example only. Alternate embodiments could have more or fewer light-emitting elements 320 formed beneath any given first conformal layer 160.

Furthermore, the orientation of the light-emitting elements that make up a given pattern can be varied according to the design of the pattern and the desired brightness in each area of the pattern.

Patterning the Light-Emitting Elements

Figure 9:
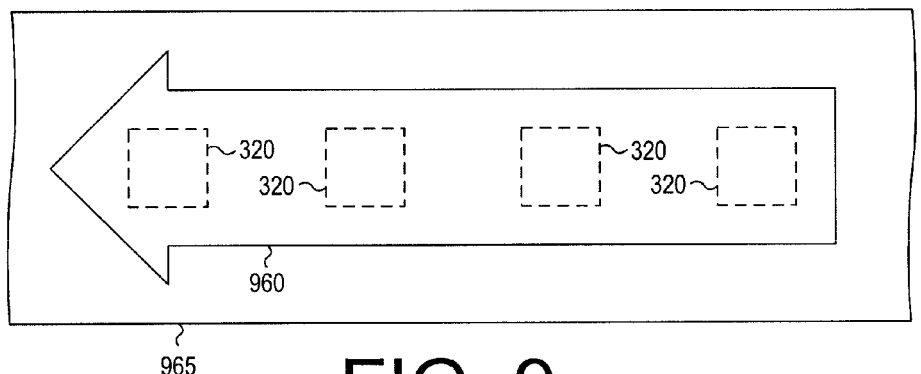
FIG. 9 is an overhead view of a portion of a lighting device having a pattern of light-emitting elements according to a disclosed embodiment.

FIG. 9 is an overhead view of a portion of a lighting device having a pattern of light-emitting elements according to a disclosed embodiment. As shown in FIG. 9, four light-emitting elements 320 are arranged in a line. A first conformal layer 960 covers all four of the light-emitting elements 320, while a second conformal layer 965 covers an area of the lighting device that does not contain the four light-emitting elements 320.

In the embodiment of FIG. 9, the four light-emitting elements 320 are formed in a line, but the first conformal layer 960 is patterned to look like an arrow. In particular, the arrow has a flat and an end with an arrowhead, indicating direction. Thus, although the four light-emitting elements 320 are simply formed in a line, an observer seeing the lighting device will see a glowing arrow, because the first conformal layer 960 will diffuse the light from the four light-emitting elements 320 to cause the entire arrow-shaped first conformal layer 960 to glow.

In this way, the embodiment of FIG. 9 can take what would have otherwise been simply a line of points of light, and change it into an arrow that indicates direction. This can be very useful in any situation in which direction is important.

Figure 10:
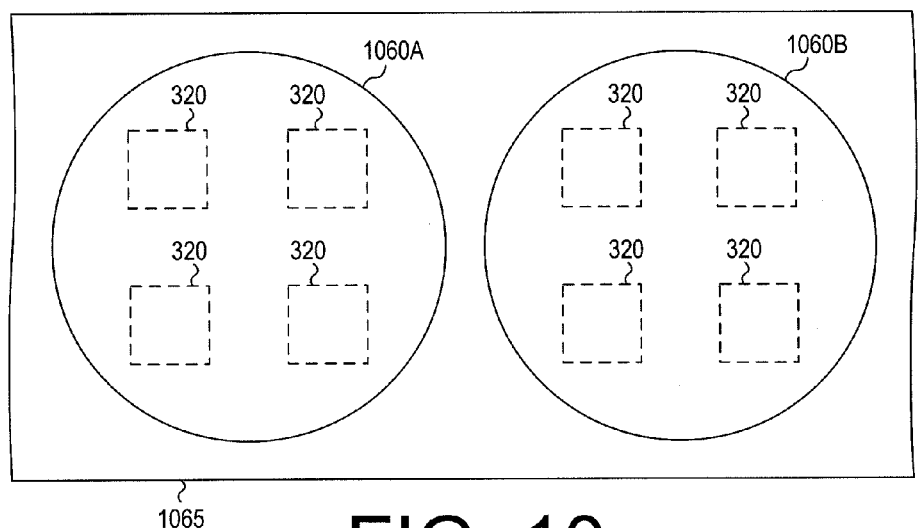
FIG. 10 is an overhead view of a portion of a lighting device having a pattern of light-emitting elements according to another disclosed embodiment.

FIG. 10 is an overhead view of a portion of a lighting device having a pattern of light-emitting elements according to another disclosed embodiment. As shown in FIG. 10, eight light-emitting elements 320 are arranged in a in two blocks. A first conformal layer portion 1060A covers a first four of the light-emitting elements 320, a first conformal layer portion 1060B covers a second four of the light-emitting elements 320, while a second conformal layer 965 covers an area of the lighting device that does not contain the eight light-emitting elements 320.

In the embodiment of FIG. 10, the eight light-emitting elements 320 are formed as two blocks of four (i.e., as to squares), but the first conformal layer portions 1060A and 1060B are patterned to look like a pair of circles. Thus, although the eight light-emitting elements 320 are simply formed to show two squares, an observer seeing the lighting device will see a pair of glowing circles, because the first conformal layer portions 1060A and 1060B will diffuse the light from the eight light-emitting elements 320 to cause the circle-shaped first conformal layer portion 1060A and the circle-shaped first conformal layer portioned 1060B to glow.

In this way, the embodiment of FIG. 10 can take what would have otherwise been simply two blocks of points of light, and change them into a pair of circles. This can be very useful in any situation in which a circular shape is required. Otherwise, a large number of light-emitting elements 320 would be required to obtain a circular shape. This would also limit the minimum size of potential circular shapes based on the minimum number of light-emitting elements 320 required to make such a shape.

Figure 11:
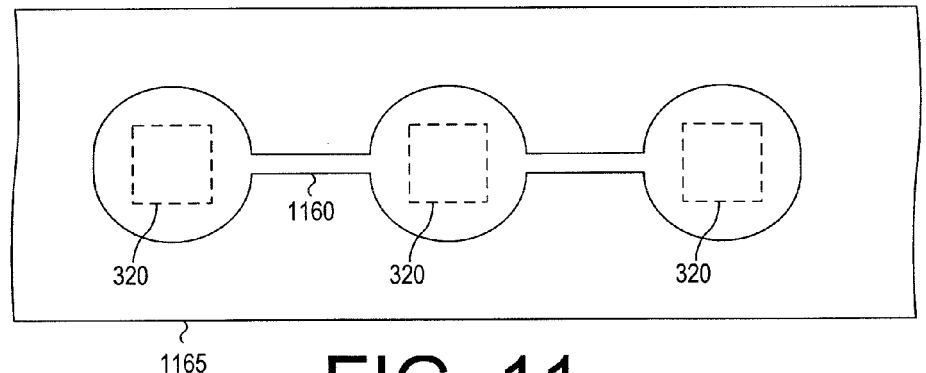
FIG. 11 is an overhead view of a portion of a lighting device having a pattern of light-emitting elements according to yet another a disclosed embodiment.

FIG. 11 is an overhead view of a portion of a lighting device having a pattern of light-emitting elements according to yet another a disclosed embodiment. As shown in FIG. 11, three light-emitting elements 320 are arranged in a line. A first conformal layer 1160 covers all four of the light-emitting elements 320, while a second conformal layer 1165 covers an area of the lighting device that does not contain the four light-emitting elements 320.

In the embodiment of FIG. 11, the three light-emitting elements 320 are formed in a line, but the first conformal layer 1160 is patterned to look like a series of circles connected by lines. Thus, although the four light-emitting elements 320 are simply formed in a line, an observer seeing the lighting device will see three glowing circles connected by lines, because the first conformal layer 1160 will diffuse the light from the three light-emitting elements 320 to cause the entire first conformal layer 1160 to glow.

In this way, the embodiment of FIG. 9 can take what would have otherwise been simply a line of points of light, and change it into a complex pattern of circles connected by lines. This shows how the disclosed system and method can be used to create complex patterns. As a result, it should not be limited to making simple patterns or geometric shapes.

Although in FIGS. 9-11, only light-emitting elements 320 are disclosed, any of these light-emitting elements 320 could be oriented in a top direction, a bottom direction, or a side direction, as desired based on the pattern and the desired brightness of each portion of the pattern.

Furthermore, although only three patterns are shown in FIGS. 9-11, this is by way of example only. Any desired shape or pattern can be used to shape the first conformal layer 160 (e.g., triangle, hexagon, octagon, rectangle, curved line, etc.). In this way greater detail can be provided to the viewer, as a simple arrangement of light-emitting elements can be diffused into a much more detailed glowing shape through the use of a first conformal layer 160 that is doped with a luminescent material.

Alternate Embodiments

Figure 12:
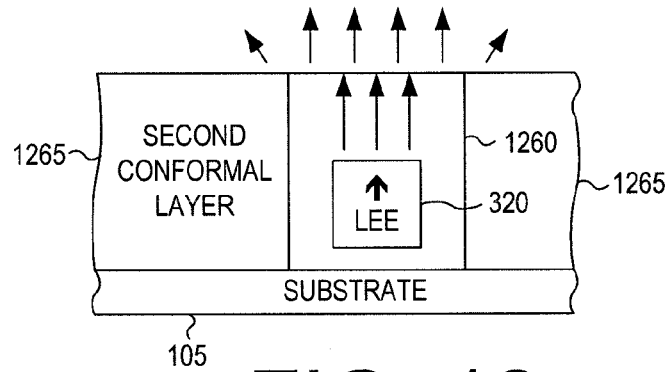
FIG. 12 is a cross-sectional view of a lighting device according to first alternate disclosed embodiments.

Although FIGS. 1-3 and 5-8 show one embodiment for depositing the first and second conformal layers, this is only by way of example. Numerous alternate embodiments are possible FIG. 12 is a cross-sectional view of a lighting device according to first alternate disclosed embodiments. As shown in FIG. 12, a light-emitting element 320 is deposited on a substrate 105, as shown in FIG. 1 or 2, except for the deposition of the affixing layer 150, the first conformal layer 160, and the second conformal layer 165.

A first conformal layer 1260 (doped with a luminescent material) is deposited over the substrate 105 and the light-emitting element 320 such that the first conformal layer covers the entire light-emitting element 320 and a vicinity around. In this way, the first conformal layer 1260 performs the functions of both the affixing layer 150 and the first conformal layer 160 in FIGS. 1 and 2. As noted above, the first conformal layer 160 can be shaped into any desired shape, as seen from above the device.

A second conformal layer 1265 (not doped with a luminescent material) is deposited over the remainder of the substrate 105 not in the vicinity of the light-emitting element 320. In this way, the second conformal layer 1265 performs the functions of both the affixing layer 150 and the second conformal layer 165 in FIGS. 1 and 2.

In this way, a patterned first conformal layer 1260 can be formed over one or more light-emitting elements 320, with a second conformal layer 1265 covering the remainder of the device.

Figure 13:
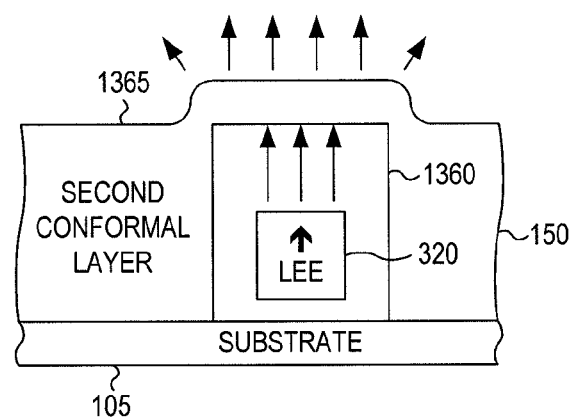
FIG. 13 is a cross-sectional view of a lighting device is according to second disclosed embodiments.

FIG. 13 is a cross-sectional view of a lighting device is according to second disclosed embodiments. As shown in FIG. 13, a light-emitting element 320 is deposited on a substrate 105, as shown in FIG. 1 or 2, except for the deposition of the affixing layer 150, the first conformal layer 160, and the second conformal layer 165.

A first conformal layer 1360 (doped with a luminescent material) is deposited over the substrate 105 and the light-emitting element 320 such that the first conformal layer covers the entire light-emitting element 320 and a vicinity around. In this way, the first conformal layer 1360 performs the functions of both the affixing layer 150 and the first conformal layer 160 in FIGS. 1 and 2. As noted above, the first conformal layer 160 can be shaped into any desired shape, as seen from above the device.

A second conformal layer 1365 (not doped with a luminescent material) is deposited over the entirety of the substrate 105 and the light-emitting element 320. In this way, the second conformal layer 1365 performs the functions of both the affixing layer 150 and the second conformal layer 165 in FIGS. 1 and 2. Although the second conformal layer 1365 is formed over the first conformal layer 1360, this should not change the operation of the first conformal layer 1360, since light will pass freely through the second conformal layer 1365 without being diffused.

In this way, a patterned first conformal layer 1360 can be formed over one or more light-emitting elements 320, with a second conformal layer 1365 covering the entire device. This can make for a simpler manufacturing process, since there is no need to prohibit the second conformal layer 1365 from covering the patterned first conformal layer 1360.

Figure 14:
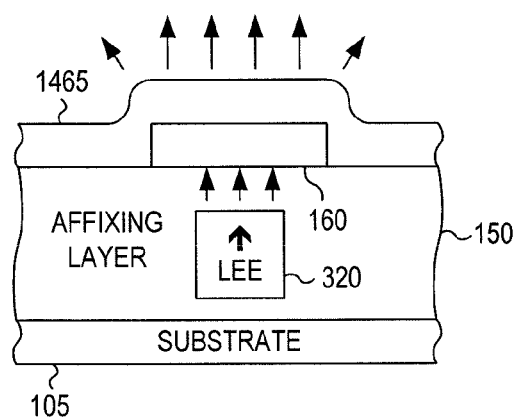
FIG. 14 is a cross-sectional view of a lighting device according to third disclosed embodiments.

FIG. 14 is a cross-sectional view of a lighting device according to third disclosed embodiments. As shown in FIG. 14, a light-emitting element 320, an affixing layer 150, and a shaped first conformal layer 160 are deposited on a substrate 105, as shown in FIG. 1 or 2, except for the deposition of second conformal layer 165.

A second conformal layer 1465 is deposited over the entirety of the substrate 105, the light-emitting element 320, the affixing layer 150, and the first conformal layer 160. Although the second conformal layer 1465 is formed over the first conformal layer 160, this should not change the operation of the first conformal layer 160, since light will pass freely through the second conformal layer 1365 without being diffused.

In this way, a patterned first conformal layer 160 can be formed over one or more light-emitting elements 320, with a second conformal layer 1465 covering the entire device. This can make for a simpler manufacturing process, since there is no need to prohibit the second conformal layer 1465 from covering the patterned first conformal layer 160.

Figure 15:
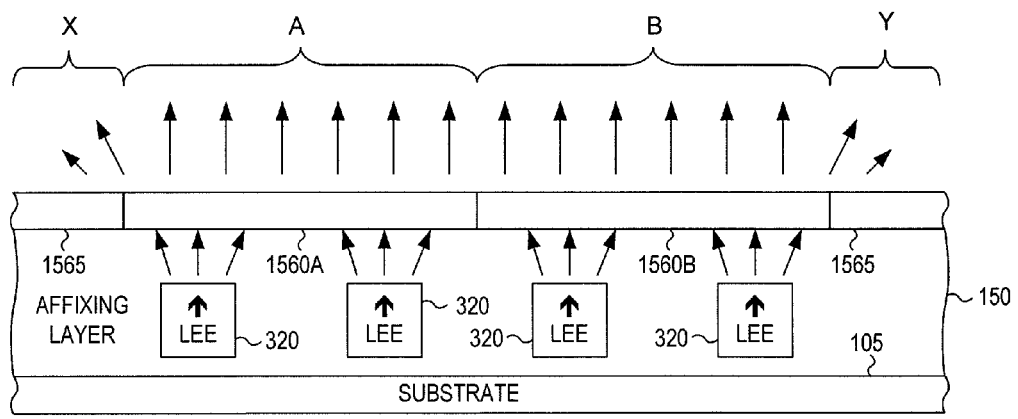
FIG. 15 is a cross-sectional view of a lighting device according to fourth disclosed embodiments.

FIG. 15 is a cross-sectional view of a lighting device according to fourth disclosed embodiments. As shown in FIG. 15, a plurality of light-emitting elements 320, and an affixing layer 150 are deposited on a substrate 105, as shown in FIGS. 1, 2, and 5, except for the deposition of the first and second conformal layers 160, 165.

A first conformal layer portion 1560A is deposited over a first group of light-emitting elements 320 in an area A, while a first conformal layer portion 1560B is deposited over a second group of light-emitting elements 320 in an area B. These different first conformal layer portions 1560A and 1560B can be patterned such that together they form a desired pattern.

However, in order to obtain different light intensities, the first conformal layer portions 1560A and 1560B are deposited at the same thickness, but are doped with different concentrations of luminescent material. As a result, all other factors being equal, the first conformal layer portions 1560A and 1560B will glow with different intensities of light. This can allow for markup located and more subtle patterns to be used.

The second conformal layer 1565 is then deposited over the portion of the substrate 105 not covered by the light-emitting elements 320, as shown above in FIGS. 1-3 and 5-8.

Although in FIG. 15 only two first conformal layer portions are provided, this is by way of example only. In alternate embodiments, larger numbers of first conformal layer portions can be used to further define the desired pattern. These multiple first conformal layer portions can each have its own concentration of luminescent material to obtain a desired light intensity, as required for the desired pattern.

Figure 16:
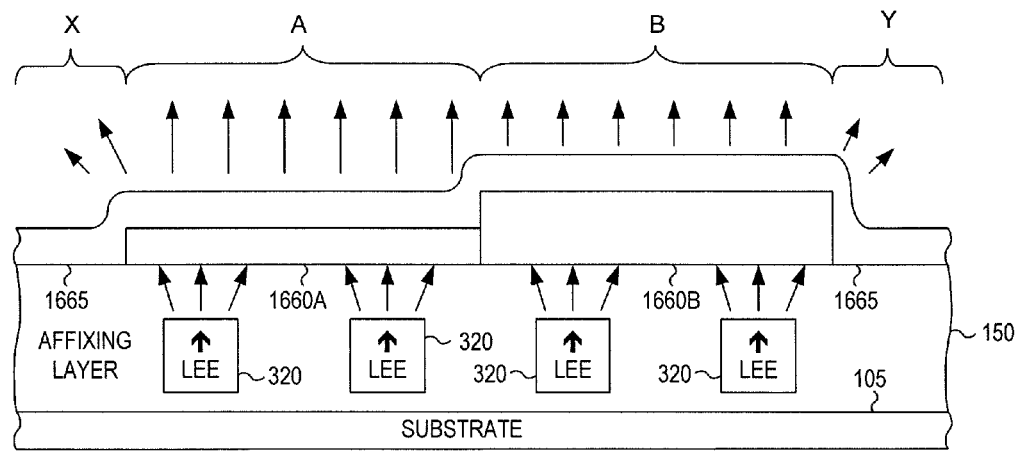
FIG. 16 is a cross-sectional view of a lighting device according to fifth disclosed embodiments.

FIG. 16 is a cross-sectional view of a lighting device according to fifth disclosed embodiments. As shown in FIG. 16, a plurality of light-emitting elements 320, and an affixing layer 150 are deposited on a substrate 105, as shown in FIGS. 1, 2, and 5, except for the deposition of the first and second conformal layers 160, 165.

A first conformal layer portion 1660A is deposited over a first group of light-emitting elements 320 in an area A, while a first conformal layer portion 1660B is deposited over a second group of light-emitting elements 320 in an area B. These different first conformal layer portions 1660A and 1660B can be patterned such that together they form a desired pattern.

However, in order to obtain different light intensities, the first conformal layer portions 1660A and 1660B are doped with the same concentration of luminescent material, but are deposited at different thicknesses. As a result, all other factors being equal, the first conformal layer portions 1660A and 1660B will glow with different intensities of light. This can allow for markup located and more subtle patterns to be used.

The second conformal layer 1665 is then deposited over the entirety of the substrate 105, including the light-emitting elements 320, as shown above in FIGS. 1-3, 5-8, and 14.

Although in FIG. 16, only two first conformal layer portions are provided, this is by way of example only. In alternate embodiments, larger numbers of first conformal layer portions can be used to further define the desired pattern. These multiple first conformal layer portions can each have its own thickness to obtain a desired light intensity, as required for the desired pattern.

Although in FIG. 15 the second conformal layer 1565 is not formed over the first conformal layer portions 1560A, 1560B, while in FIG. 16 the second conformal layer 1665

In addition, although in FIGS. 15 and 16, all of the light-emitting elements 320 are shown as being oriented to emit light in a top direction, this is by way of example only. In alternate embodiments, some or all of the light-emitting elements 320 can be oriented to emit light in a bottom or a side direction. This, in combination with the multiple conformal layer portions can be used to provide even more granularity in produced light intensity, allowing for more complicated patterns.

Furthermore, the embodiments of FIGS. 15 and 16 could also be created using the embodiments shown in FIGS. 12 and 13, with respect to the first and second conformal layers. In such case, different light-emitting elements 320 would be covered with first conformal layer portions having different doping concentrations of luminescent material, or different thicknesses.

Furthermore, alternate embodiments could mix the details disclosed in FIGS. 15 and 16, varying both the thickness and the dopant concentration in multiple first conformal layer portions.

Method of Fabrication

Figures 17, 18:
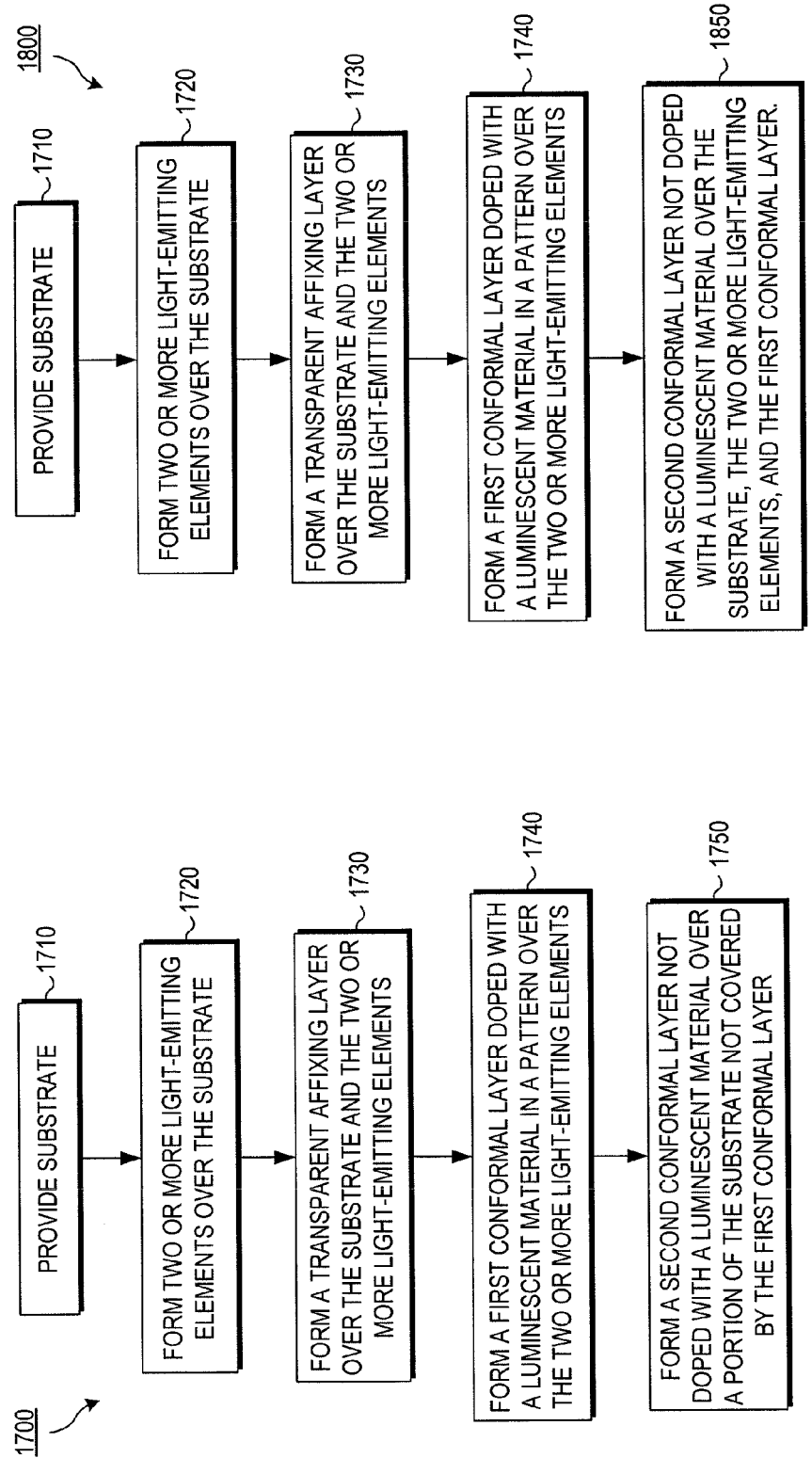
FIG. 17 is a flow chart of a method of fabricating a lighting device according to disclosed embodiments.
FIG. 18 is a flow chart of a method of fabricating a lighting device according to other disclosed embodiments.

FIG. 17 is a flow chart 1700 of a method of fabricating a lighting device according to disclosed embodiments. As shown in FIG. 17, the operation begins by providing a substrate 105 (1510).

Two or more light-emitting elements 320 are then placed over the substrate 150 (1520). These light-emitting elements 320 can be formed as shown in FIG. 1 or FIG. 2, depending upon what type of light-emitting element is used. In addition, as noted above, in different embodiments, these light-emitting elements 320 can be placed in a variety of different orientations, including top-facing, bottom-facing, and side-facing.

A transparent affixing layer 150 is then formed over the substrate 150 and the two or more light-emitting elements 320 (1530). In alternate embodiments in which no affixing layer 150 is used, this operation can be omitted.

A patterned first conformal layer 160, doped with a luminescent material, is formed over the two or more light-emitting elements 320 (1540). This first conformal layer 160 is formed such that it displays a desired pattern when looked at from above. As noted above, in different embodiments, multiple first conformal layer portions can be used having different luminescent dopant intensities or different thicknesses.

A second conformal layer 165, not doped with a luminescent material, is then deposited over a portion of the substrate 150 not covered by the first conformal layer 160 (i.e., not in the region of the two or more light-emitting elements 320) (1550).

FIG. 18 is a flow chart 1800 of a method of fabricating a lighting device according to other disclosed embodiments. As shown in FIG. 18, this fabrication method is the same as the fabrication method of FIG. 17 from operation 1510 through operation 1540. As a result, these operations will not be described again.

After the first conformal layer 160 is formed over the two or more light-emitting elements 320 (1540), a second conformal layer 165, not doped with a luminescent material, is then deposited over the entire substrate 150 including the area covered by the first conformal layer 160 (i.e. the second conformal layer 165 is deposited over the region of the two or more light-emitting elements 320) (1650).

CONCLUSION

This disclosure is intended to explain how to fashion and use various embodiments in accordance with the invention rather than to limit the true, intended, and fair scope and spirit thereof The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled. The various circuits described above can be implemented in discrete circuits or integrated circuits, as desired by implementation.

What is claimed is:

1. A lighting device, comprising:
   a substrate;
   two or more light-emitting elements formed over the substrate;
   a first transparent conformal layer formed over the two or more light-emitting elements in a pattern, the first transparent conformal layer being doped with a luminescent material;
   a second transparent conformal layer formed over a portion of the substrate not covered by the two or more light-emitting elements, the second transparent conformal layer not being doped with the luminescent material.

2. The lighting device, of claim 1, wherein
   the luminescent material is remote phosphor.

3. The lighting device, of claim 1, wherein
   the first transparent conformal layer is contiguous.

4. The lighting device, of claim 1, wherein
   the luminescent material doped in the first transparent conformal converts an incoming wavelength of incoming light from the two or more light-emitting elements to an outgoing wavelength different from the incoming wavelength.

5. The lighting device, of claim 1, wherein
the first transparent conformal layer has a thickness between 0.1 micron to 10 millimeters.

6. The lighting device, of claim 1, wherein
the first transparent conformal layer comprises polyurethane, silicone, or acrylic having a refractive index between 1.7 and 2.1.

7. The lighting device, of claim 1, wherein
the pattern is one of: a circle, a square, a triangle, a line, or an arrow.

8. The lighting device, of claim 1, further comprising
a transparent affixing layer formed between the first and second transparent conformal layers and the substrate, the transparent affixing layer surrounding the two or more light-emitting elements.

9. The lighting device, of claim 1, wherein
at least one of the first and second transparent conformal layers is made of a flame retardant material.

10. The lighting device, of claim 1, wherein
the two or more light-emitting elements are two or more light-emitting diodes, and
each corresponding light-emitting diode of the two or more light-emitting diodes has a pair of electrodes formed on a same side of the corresponding light-emitting diode.

11. The lighting device, of claim 1, wherein
the two or more light-emitting elements are two or more light-emitting diodes, and
each corresponding light-emitting diode of the two or more light-emitting diodes has a pair of electrodes formed on different sides of the corresponding light-emitting diode.

12. The lighting device, of claim 1, wherein
the two or more light-emitting elements include a first light-emitting element and a second light-emitting element,
the first light-emitting element is configured to emit light in a first direction, and
the second light-emitting element is configured to emit light in a second direction different from the first direction.

13. The lighting device, of claim 1, wherein
the first direction is toward the first transparent conformal layer, and
the second direction is toward the substrate.

14. A method of forming a lighting device, comprising:
providing a substrate;
forming two or more light-emitting elements over the substrate;
forming a first transparent conformal layer over the two or more light-emitting elements in a pattern, the first transparent conformal layer being doped with a luminescent material;
forming a second transparent conformal layer over a portion of the substrate not covered by the two or more light-emitting elements, the first transparent conformal layer not being doped with the luminescent material.

15. The lighting device, of claim 14, wherein
the luminescent material is remote phosphor.

16. The lighting device, of claim 14, wherein
the first transparent conformal layer is contiguous.

17. The lighting device, of claim 14, wherein
the luminescent material doped in the first transparent conformal converts an incoming wavelength of incoming light from the two or more light-emitting elements to an outgoing wavelength different from the incoming wavelength.

18. The lighting device, of claim 14, wherein
the first transparent conformal layer has a thickness between 0.1 micron to 10 millimeters.

19. The lighting device, of claim 14, wherein
the first transparent conformal layer comprises polyurethane, silicone, or acrylic having a refractive index between 1.7 and 2.1.

20. The lighting device, of claim 14, wherein
the pattern is one of: a circle, a square, a triangle, a line, or an arrow.

21. The lighting device, of claim 14, further comprising
forming a transparent affixing layer between the first and second transparent conformal layers and the substrate, the transparent affixing layer surrounding the two or more light-emitting elements.

22. The lighting device, of claim 14, wherein
at least one of the first and second transparent conformal layers is made of a flame retardant material.

23. The lighting device, of claim 14, wherein
the two or more light-emitting elements are two or more light-emitting diodes, and
each corresponding light-emitting diode of the two or more light-emitting diodes has a pair of electrodes formed on a same side of the corresponding light-emitting diode.

24. The lighting device, of claim 14, wherein
the two or more light-emitting elements are two or more light-emitting diodes, and
each corresponding light-emitting diode of the two or more light-emitting diodes has a pair of electrodes formed on different sides of the corresponding light-emitting diode.

25. The lighting device, of claim 14, wherein
the two or more light-emitting elements include a first light-emitting element and a second light-emitting element,
the first light-emitting element is configured to emit light in a first direction, and
the second light-emitting element is configured to emit light in a second direction different from the first direction.

26. The lighting device, of claim 14, wherein
the first direction is toward the first transparent conformal layer, and
the second direction is toward the substrate.

* * * * *

UNITED STATES PATENT AND TRADEMARK OFFICE
CERTIFICATE OF CORRECTION

PATENT NO. : 9,099,618 B1
APPLICATION NO. : 14/251022
DATED : August 4, 2015
INVENTOR(S) : Cesar Perez-Bolivar and Michael Redwine Page 1 of 1

It is certified that error appears in the above-identified patent and that said Letters Patent is hereby corrected as shown below:

What is claimed is:

Col. 16, claim 14, lines 1-2, change:

"the first transparent conformal layer"

to

--the second transparent conformal layer--

Signed and Sealed this
Fifth Day of April, 2016

Michelle K. Lee
*Director of the United States Patent and Trademark Office*